United States Patent [19]

Morii et al.

[11] 4,163,203
[45] Jul. 31, 1979

[54] TUNING APPARATUS FOR SELECTING PRESET BROADCAST FREQUENCIES

[75] Inventors: Kokichi Morii, Chigasaki; Kohei Haneishi, Musashino, both of Japan

[73] Assignee: Sony Corporation, Tokyo, Japan

[21] Appl. No.: 890,916

[22] Filed: Mar. 28, 1978

[30] Foreign Application Priority Data

Mar. 30, 1977 [JP] Japan ................... 52-35979
Apr. 5, 1977 [JP] Japan ................... 52-38740

[51] Int. Cl.² ........................ H03J 1/02; H03J 3/12; H03J 1/04
[52] U.S. Cl. ........................ 334/86; 334/30; 116/263
[58] Field of Search ............ 334/86, 30, 36; 116/124.4, DIG. 29, DIG. 30

[56] References Cited

U.S. PATENT DOCUMENTS

| | | | |
|---|---|---|---|
| 2,060,216 | 11/1936 | Huber et al. | 334/86 |
| 2,182,572 | 12/1939 | Schnell | 334/86 |
| 2,186,828 | 1/1940 | Forstrom | 334/86 |
| 2,268,950 | 1/1942 | Leishman | 334/86 |
| 2,463,097 | 3/1949 | Gayer | 310/239 |
| 2,851,622 | 9/1958 | Hall | 310/246 |
| 3,242,362 | 3/1966 | Ciliax | 310/239 |
| 3,953,800 | 4/1976 | Nakamura et al. | 334/86 |
| 3,962,641 | 6/1976 | Suwa | 334/86 |

*Primary Examiner*—Alfred E. Smith
*Assistant Examiner*—Harry E. Barlow
*Attorney, Agent, or Firm*—Lewis H. Eslinger; Alvin Sinderbrand

[57] ABSTRACT

In a tuning apparatus for a broadcast receiver having a dial scale calibrated to represent broadcast frequencies over a predetermined frequency band, and along which an indicator is movable for indicating the broadcast frequency to which the tuning apparatus is actually tuned; a sensor is movable with the indicator, at least one presetting element is movable along the dial scale for indicating a respective preset broadcast frequency and each such element coacts with the sensor whenever the broadcast frequency to which the tuning apparatus is tuned corresponds to the respective preset broadcast frequency, a control signal generator produces a control signal in response to the coaction of the sensor with each of the presetting elements, and a control circuit is responsive to the control signal to control a function of the tuning apparatus, such as, a muting and/or automatic frequency control operation of the tuning apparatus.

8 Claims, 5 Drawing Figures

TUNING APPARATUS FOR SELECTING PRESET BROADCAST FREQUENCIES

BACKGROUND OF THE INVENTION

1. Field of the Invention

This invention relates generally to a tuning apparatus, and more particularly is directed to a novel tuning apparatus in which a function thereof, such as, a muting and/or automatic frequency control operation of the tuning apparatus, is controlled in dependence on the relation of the tuned broadcast frequency to one or more preset broadcast frequencies.

2. Description of the Prior Art

In a prior art radio receiver, inter-station noise is eliminated by providing a muting gate in a signal transmitting path and controlling such muting gate by a rectified output signal from an IF amplifier. An FM receiver is also well-known in which a DC output signal of an FM discriminator and a rectified output signal of the IF amplifier are both detected and a logic circuit controls the muting gate in response to both of such output signals. With a muting circuit of the foregoing type, the broadcast signal from any station received with a level higher than a predetermined value will be transmitted through the muting gate. In other words, the muting circuit is effective to eliminate only those broadcast signals received at levels below the predetermined value. By reason of the foregoing, the existing muting circuit does not facilitate the manipulation of a tuning apparatus for receiving signals from only a limited number of preselected stations in cases where the broadcast signals from many stations may be received at acceptable levels.

Although automatic tuning radio receivers of the μ-tuning type are available for receiving only the signals from specific broadcast stations, such μ-tuning type receivers are relatively complicated and expensive.

Furthermore, it has been known to provide a radio receiver with an automatic frequency control circuit (hereinafter referred to as an AFC circuit) in order to stabilize the receiving condition. However, when it is desired to receive the broadcast signal from only one of several stations that may be within the pull-in range of the AFC operation, the existing receiver does not afford a simple control for both the AFC operation and the muting operation.

OBJECTS AND SUMMARY OF THE INVENTION

Accordingly, it is an object of this invention to provide a tuning apparatus for a broadcast receiver that is free of the above-mentioned disadvantages of the prior art.

More specifically, it is an object of this invention to provide a tuning apparatus for a broadcast receiver in which a simple arrangement is provided for controlling a function of the tuning apparatus, for example, for making inoperative a muting circuit, when the broadcast frequency to which the apparatus is actually tuned corresponds to any one of a plurality of preset broadcast frequencies.

Another object of the invention is to provide a tuning apparatus, as aforesaid, in which an AFC circuit is made operative only when the broadcast frequency to which the apparatus is tuned is within a predetermined range in respect to any one of the preset broadcast frequencies.

In accordance with an aspect of this invention, a tuning apparatus for a broadcast receiver comprises a dial scale calibrated to represent broadcast frequencies over a predetermined frequency band and along which an indicator is movable for indicating the broadcast frequency to which the tuning apparatus is tuned, a sensor assembly movable with the indicator, at least one presetting element movable along the dial scale for indicating a respective preset broadcast frequency and coacting with the sensor assembly when the tuned broadcast frequency corresponds to the respective preset broadcast frequency, a control signal generator for producing a control signal in response to the coaction of the sensor assembly with each presetting element, and a control circuit responsive to such control signal for controlling a function of the tuning apparatus, such as, a muting and/or AFC operation of the tuning apparatus.

In a particularly desirable embodiment of the invention, the sensor assembly is constituted by a light source and a photo-sensitive element spaced from the light source for normally receiving light therefrom, and each presetting element is movable individually along the dial scale for indicating a respective preset broadcast frequency and has a shutter portion adapted to be selectively interposed between the light source and photo-sensitive element for blocking the reception of light by the latter when the indicator and the respective presetting element are disposed to indicate the same broadcast frequency on the dial scale.

The above, and other objects, features and advantages of the invention, will be apparent from the following detailed description of illustrative embodiments which is to be read in conjunction with the accompanying drawings.

DESCRIPTION OF THE PREFERRED EMBODIMENTS

Figure 1:
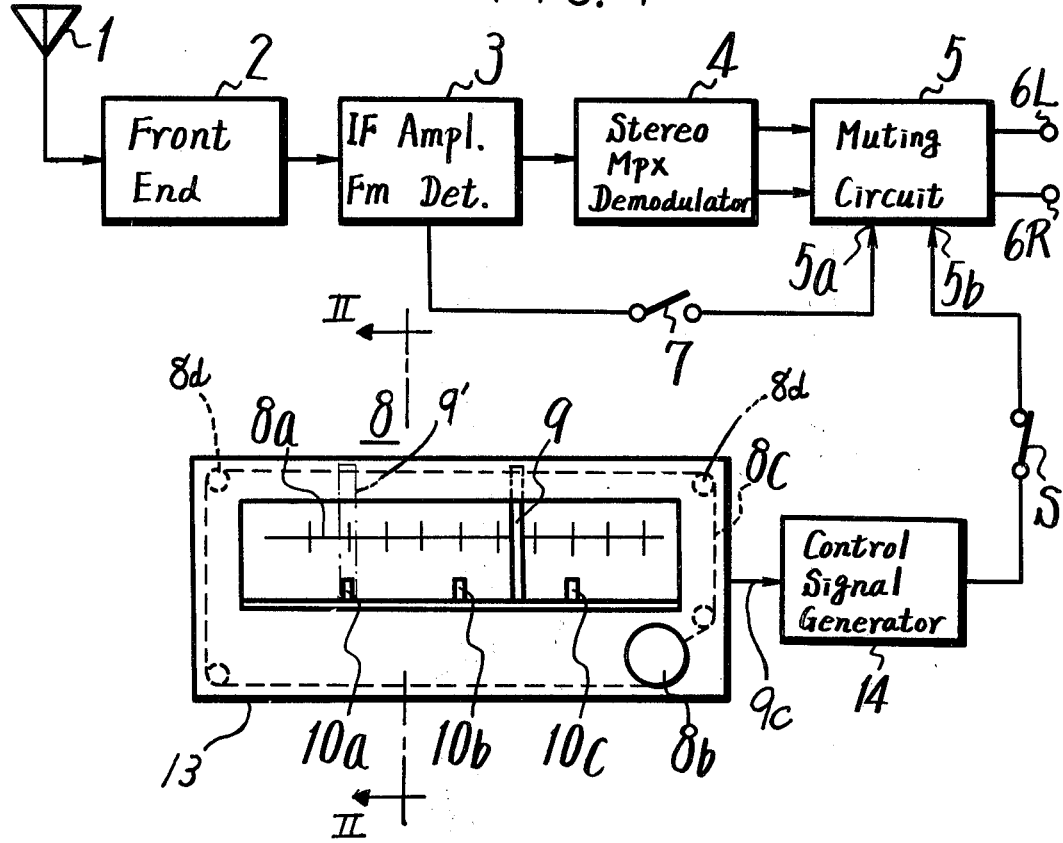
FIG. 1 is a schematic block diagram showing a tuning apparatus according to one embodiment of this invention.

Referring to the drawings in detail, and initially to FIG. 1 thereof, it will be noted that the invention is there shown applied to a tuning apparatus for an FM radio receiver having an antenna 1 for receiving a broadcast signal. The received broadcast signal is applied from antenna 1 to a front end 2 which, as is usual, may include an RF amplifier, a local oscillator and a mixer to provide an intermediate frequency signal which is fed through a circuit 3 comprised of an IF amplifier and an FM detector to a stereo MPX demodulator 4. Right and left signals obtained at the output of stereo MPX demodulator 4 are delivered through a muting circuit 5 to right and left signal output terminals 6R and 6L, respectively. In the tuning apparatus of FIG. 1, the FM detector of circuit 3 produces a control signal in response to a signal level in the associated IF amplifier below a predetermined value, and such control signal, when supplied through a manually operable switch 7 to a control terminal 5a of muting circuit 5, causes the latter to perform a muting operation.

The tuning apparatus of FIG. 1 is further shown to include a dial assembly 8 having a dial scale 8a representing broadcast frequencies over a predetermined frequency band, a dial indicator 9 movable along a scale 8a for indicating the broadcast frequency to which the apparatus is tuned, and a plurality of presetting elements 10a, 10b and 10c which are individually movable along dial scale 8a for selecting different respective broadcast frequencies to be received. The broadcast frequency to which the apparatus is tuned is determined by manual rotation of a knob 8b which is coupled with the shaft of a variable capacitor (not shown). In the case where the dial scale 8a is rectilinear, as shown, the indicator 9 may be fixed, at its upper end, to an elongated flexible element or string 8c at a location along a run of the latter extending between guide rollers 8d parallel to dial scale 8a. The flexible element or string 8c is further wrapped about the shaft of knob 8b so that, upon manual turning of such knob for changing the broadcast frequency to which the apparatus is tuned, string 8c causes corresponding displacement of indicator 9 along dial scale 8a for indicating on such scale the broadcast frequency to which the apparatus is actually tuned at any time.

In accordance with this invention, a sensor assembly is movable with indicator 9 in respect to dial scale 8a and is adapted to coact with each of the presetting elements 10a, 10b and 10c when indicator 9 is disposed to indicate the same broadcast frequency as the respective one of the presetting elements. As shown particularly on FIGS. 2 and 3, the sensor assembly may desirably include a photo-sensitive element 9a, such as, a photo-diode, phototransistor, or the like, and a light source 9b, such as, a lamp, light emitting diode (LED), or the like, which are suitably mounted at the lower end portion of indicator 9 so that light source 9b will direct light against photosensitive element 9a across a gap therebetween.

Figure 2:
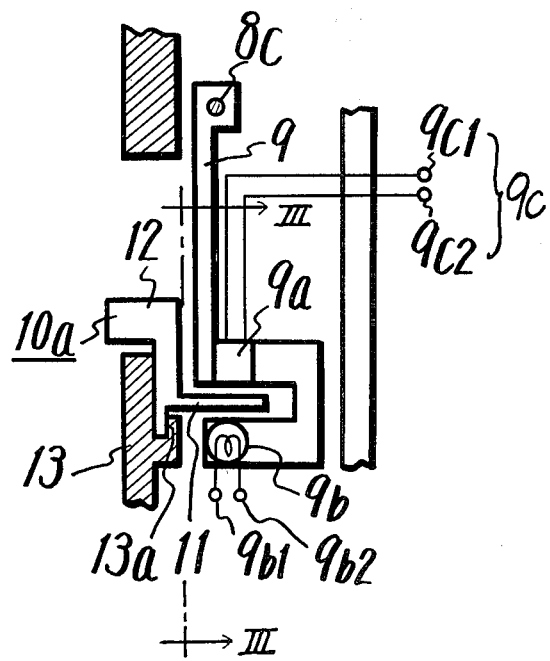
FIG. 2 is an enlarged detail sectional view taken along the line II—II on FIG. 1 and which illustrates the coaction of a sensor assembly with a presetting element provided in accordance with this invention.
Figure 3:
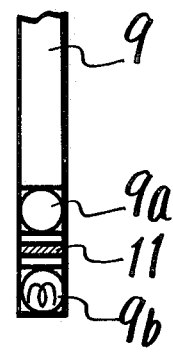
FIG. 3 is a detail sectional view taken along the line III—III on FIG. 2.

As shown on FIG. 2 in respect to presetting element 10a, each of elements 10a, 10b and 10c includes a shutter portion 11 adapted to extend into the gap between light source 9b and photo-sensitive element 9a for blocking the impingement on the latter of light from source 9b. Each of the presetting elements further includes a knob and indicating portion 12 adapted to be exposed at a window in the dial panel 13 which, at its inner surface, is formed with a groove 13a in which slide portions of presetting elements 10a-10c are slidably engaged. It will be apparent that each knob and indicating portion 12 is adapted to be manually grasped for movement of the respective presetting element to a position relative to dial scale 8a which corresponds to the broadcast frequency of a selected broadcast station. When the tuning apparatus is tuned to a broadcast frequency indicated by any one of presetting elements 10a-10c, for example, when indicator 9 is moved to the position shown in broken lines at 9' on FIG. 1 so as to indicate that the apparatus is tuned to the broadcast frequency of the station selected by presetting element 10a, shutter portion 11 of presetting element 10a then extends into the gap between photo-sensitive element 9a and light source 9b so as to block the impingement of light on the light-sensitive element. Similarly, the impingement of light on light-sensitive element 9a will be blocked whenever the apparatus is tuned to the broadcast frequency for which the presetting element 10b or 10c is set.

As hereinafter described in detail, the output of photo-sensitive element 9a may be employed for controlling the operation of muting circuit 5 so that, for example, the muting operation is disabled whenever the apparatus is tuned to a broadcast frequency corresponding to the broadcast frequency selected by any one of the presetting elements 10a-10c, that is, whenever shutter portion 11 of one of the presetting elements blocks the impingement of light on photo-sensitive element 9a. It will be apparent that the width of shutter portion 11 of each of the presetting elements 10a-10c determines the width of each frequency band centered at the location of the respective presetting element and over which the muting operation will be disabled. For example, the width of each shutter portion 11 may be selected in relation to the calibration of dial scale 8a so that the muting operation of circuit 5 will be disabled over a frequency band of, for example, ±75 to 100 KHz, in respect to the broadcast frequency indicated by the position of the respective knob 12 relative to the dial scale 8a.

In the tuning apparatus of FIG. 1, the output 9c of photo-sensitive element 9a is shown to be applied to a control signal generator 14 which provides a corresponding control signal through a connecting switch S to a control terminal 5b of muting circuit 5. Generally, when indicator 9 is displaced from all of the presetting elements 10a-10c, as shown in full lines on FIG. 1, thereby indicating that the apparatus is tuned to a broadcast frequency other than the broadcast frequencies selected by presetting elements 10a-10c, photo-sensitive element 9a receives light from source 9b and control signal generator 14 responds to the corresponding output from photo-sensitive element 9a to provide a control signal at a first level which, when supplied through switch S to control terminal 5b, permits muting circuit 5 to perform its muting operation. On the other hand, when indicator 9 is disposed at substantially the same position relative to dial scale 8a as any one of presetting elements 10a-10c, thereby indicating that the apparatus is tuned to the broadcast frequency of one of the selected stations, the impingement of light on photo-sensitive element 9a is blocked and generator 14 responds to the corresponding output from element 9a to provide a control signal at a second level which, when applied through switch S to control terminal 5b, is effective to disable or prevent the muting operation of circuit 5. Thus, the right and left signals can be delivered to the terminals 6R and 6L only when the tuning apparatus is tuned to a broadcast frequency that substantially corresponds to the broadcast frequency of one of the previously selected stations. Of course, instead of controlling the muting circuit 5 by the control signal from generator 14, as described above, the same effect can be achieved by employing the control signal from generator 14 for tuning ON and OFF a power supply (not shown) of front end 2. In the latter case, the power supply of front end 2 is turned ON to permit the right and left signals to be supplied at terminals 6R and 6L only when the control signal from generator 14 is at the level corresponding to the disposition of indicator 9 at substantially the same position as one of the presetting elements 10a–10c relative to dial scale 8a.

Figure 4:
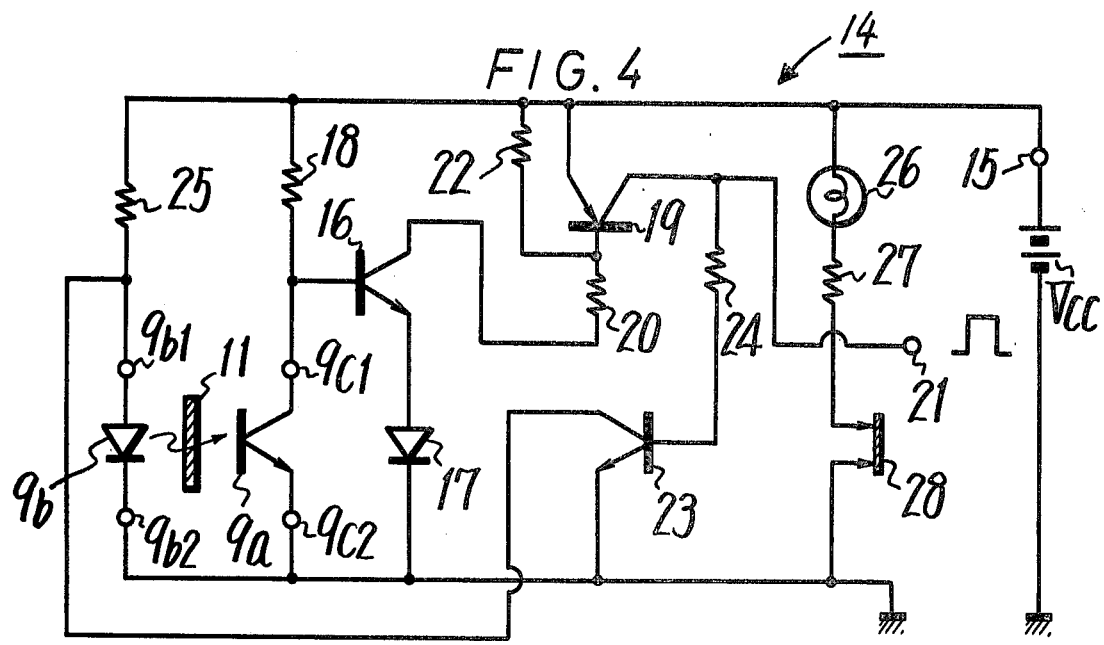
FIG. 4 is a circuit diagram showing details of a control signal generator that may be employed in the tuning apparatus according to this invention.

Referring now to FIG. 4, it will be seen that the photo-sensitive element 9a is there shown in the form of a photo-transistor having its collector and emitter respectively connected to terminals $9c_1$ and $9c_2$ and the light source 9b is shown in the form of an LED having terminals $9b_1$ and $9b_2$, and that a DC voltage source of control signal generator 14 is shown to include a first terminal 15 to which a DC voltage $+V_{cc}$ is applied and a second terminal or ground. In the control signal generator 14 of FIG. 4, a first switching transistor 16 has its base connected to terminal $9c_1$, that is, the collector of phototransistor 9a, while the emitter of the photo-transistor, that is, terminal $9c_2$, is connected to ground or to the second terminal of the DC voltage source through a diode 17. The base of transistor 16 is further shown to be connected through a resistor 18 to the first DC voltage source terminal 15, and a second switching transistor 19 has its base connected through a resistor 20 with the collector of transistor 16. The emitter of transistor 19 is connected to voltage source terminal 15 and the collector of transistor 19 is connected to an output terminal 21. The base of transistor 19 is further connected to voltage source terminal 15 through a resistor 22.

Control signal generator 14 further preferably includes a positive feedback transistor 23 having its base connected through a resistor 24 to the collector of transistor 19 while the emitter of feedback transistor 23 is connected to ground. The collector of feedback transistor 23 is shown to be connected to a connection point between terminal $9b_1$ of LED 9b and a resistor 25 connected, in turn, to voltage source terminal 15, while the other terminal $9b_2$ of the LED is connected to ground. Finally, generator 14 is shown on FIG. 4 to include an indicating lamp 26, a resistor 27 and a change-over switch 28 connected in series between voltage source terminal 15 and the ground to illuminate lamp 26, and thereby indicate the selection of an FM-auto receiving mode of operation, in response to closing of change-over switch 28.

The control signal generator 14 described above with reference to FIG. 4 operates as follows:

When a shutter portion 11 of one of presetting elements 10a–10c is inserted between LED 9b and photo-transistor 9a, that is, when the tuning apparatus is tuned to a broadcast frequency corresponding to the broadcast frequency of one of the previously selected stations, photo-transistor 9a becomes non-conductive to provide a relatively high potential at its collector or terminal $9c_1$. Accordingly, transistor 16 is turned ON to provide a low potential at the base of transistor 19 by which the latter is also turned ON. As a result of the foregoing, a control signal of a predetermined high level is obtained at the output terminal 21. Such high level control signal at terminal 21 is effective to turn ON the positive feedback transistor 23 and thereby lower the potential at terminal $9b_1$ of LED 9b. In other words, the movement of a shutter portion 11 into the gap between photo-transistor 9a and LED 9b for blocking the impingement of light on the phototransistor is accompanied by a decrease in the intensity of light emitted from LED 9b. Thus, the rising characteristic in turning ON transistor 16 can be made steep. In other words, when a shutter portion 11 is slowly moved in and out between LED 9b and photo-transistor 9a, which would cause relatively slow change-over of photo-transistor 9a between its non-conductive and conductive states, the positive feedback action provided by transistor 23 ensures that the switching speed of transistor 16 will not be undesirably lowered.

On the other hand, when a shutter portion 11 is not present between LED 9b and photo-transistor 9a, that is, when the tuning apparatus is tuned to a broadcast frequency different from that of any of the stations selected by presetting elements 10a–10c, then photo-transistor 9a becomes conductive to provide a relatively low potential at its collector or terminal $9c_1$. In response to the foregoing, switching transistors 16 and 19 are turned OFF and a low level control signal is provided at output terminal 21.

In applying the control signal generator 14 described above with reference to FIG. 4 to the tuning apparatus shown on FIG. 1, it will be apparent that output terminal 21 of generator 14 is connected through switch S to control terminal 5b of muting circuit 5. When it is desired to tune only to the selected stations for which presetting elements 10a, 10b and 10c have been set, switch 7 is opened and switch S is closed, as shown on FIG. 1. Thereafter, knob 8b is turned to vary the broadcast frequency for which the apparatus is tuned while indicator 9 is correspondingly shifted in respect to dial scale 8a. So long as indicator 9 is not coincident with any one of the presetting elements 10a, 10b and 10c, a low-level control signal is obtained at output terminal 21 of generator 14 and such control signal is effective, when applied through switch S to control terminal 5b, to cause the muting operation of muting circuit 5 to occur with the result that no signals are obtained at the right and left signal output terminals 6R and 6L. When the shifting of indicator 9 causes the latter to coincide with any one of presetting elements 10a–10c, light from LED 9b can no longer impinge on photo-transistor 9a with the result that a high level control signal is obtained at output terminal 21. Such high level control signal, when applied through switch S to control terminal 5b, disables the muting operation of muting circuit 5 and, as a result thereof, right and left signals are obtained at output terminals 6R and 6L and the broadcast signal from the corresponding previously selected station is reproduced.

It will be apparent that, in the tuning apparatus according to this invention as described above with reference to FIG. 1, only the signals from the previously selected stations for which elements 10a–10c have been respectively set can be reproduced so long as switch S in in its closed position. If desired, switch S can be opened while switch 7 is closed, in which case the usual muting operation is restored, that is, muting circuit 5 is controlled by the signal level detected at the IF amplifier in circuit 3 so as to provide a muting operation whenever the detected level is below a predetermined value.

It is also possible to control the operation of muting circuit 5 in response to both control signals applied through simultaneously closed switches 7 and S to control terminals 5a and 5b, respectively. In the latter case, the control signal from generator 14 applied to control terminal 5b is effective to disable the muting operation of muting circuit 5 when the tuning apparatus is tuned to a broadcast frequency for which one of the presetting elements 10a–10c has been previously set only if the control signal being simultaneously applied through closed switch 7 to control terminal 5a indicates that the detected signal level then being received from one of the selected stations is above a predetermined value.

Figure 5:
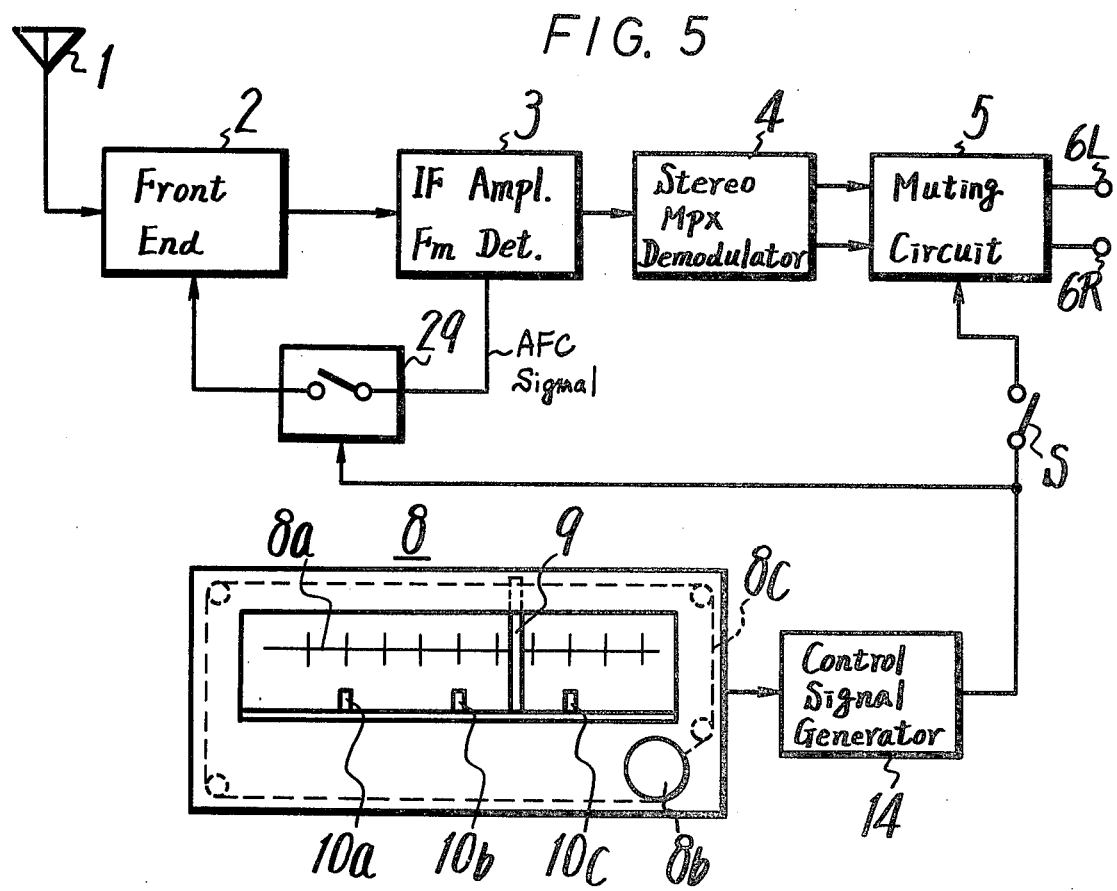
FIG. 5 is a schematic block diagram showing a tuning apparatus according to another embodiment of this invention.

Referring now to FIG. 5, it will be seen that another embodiment of this invention is there applied to an FM radio receiver provided with an AFC circuit for stabilizing the receiving condition, and the several components of the receiver which correspond to those previously described with reference to FIG. 1 are identified by the same reference numerals. Generally, in an FM radio receiver provided with an AFC circuit, the draw-in or pull-in range of the AFC circuit is selected to be, for example, about ±500 KHz. Thus, as the knob 8b is turned to shift the indicator 9 relative to dial scale 8a and to correspondingly change the broadcast frequency to which the apparatus is tuned, the AFC circuit will be operative. When the frequency indicated by indicator 9 on scale 8a is within the pull-in range, that is, ±500 KHz, in respect to the carrier frequency of a broadcast station that can be received. So long as the broadcast frequency indicated by indicator 9 on scale 8a deviates from the broadcast frequency of a receivable station by no more than ±500KHz, the AFC circuit will automatically operate to bring the tuned broadcast frequency to the carrier frequency of that receivable station. Therefore, if another broadcast station exists within the range of ±500 KHz relative to the carrier frequency of the first mentioned broadcast station, the signal from such other broadcast station may not be received even through it is the desired station.

In order to avoid the above problem while permitting the AFC circuit to be provided with a sufficiently wide draw-in range of, for example, about ±500 KHz, for stabilizing the receiving condition, the tuning apparatus of FIG. 5, which is otherwise similar to that described above with reference to FIG. 1, is shown to further include a switching circuit 29 through which an AFC control signal obtained from the FM detector of circuit 3 may be supplied to the local oscillator (not shown) of front end 2 for automatically controlling the oscillation frequency of such local oscillator. In accordance with the present invention, the control signal from generator 14 is applied to switching circuit 29 for controlling the latter as well as being applied to the previously mentioned switch S for controlling muting circuit 5. When a low level control signal is obtained at output terminal 21 of generator 14, such low level control signal, if applied through switch S to muting circuit 5, causes the latter to carry out the muting operation, as previously described with reference to FIG. 1, and the low level control signal is also effective to open switching circuit 29 with the result that the automatic frequency control signal is not applied through switching circuit 29 to the local oscillator. On the other hand, when a high level control signal is obtained at output terminal 21 of generator 14, the high level control signal acts through switch S to disable the muting operation of circuit 5, and the high level control signal from generator 14 is simultaneously operative to close switching circuit 29 and thereby permit the AFC operation to be performed.

It will be appreciated that, in the tuning apparatus according to this invention as illustrated on FIG. 5, the width of the frequency band embracing the broadcast frequency for which each of the presetting elements 10a, 10b and 10c is set, and in which the muting operation is disabled and the AFC operation is obtained is determined by the width of the shutter portion 11 of each presetting element. By way of example, the width of the shutter portion 11 may be selected in relation to the calibration of dial scale 8a so as to correspond to a frequency band width of ±75 to 100 KHz.

The operation of the tuning apparatus of FIG. 5 is as follows:

Initially, presetting elements 10a, 10b and 10c are set to positions on dial scale 8a corresponding to the broadcast frequencies of desired stations to be reproduced. Thereafter, the indicator 9 is shifted in response to turning of knob 8b for turning to a desired station. So long as indicator 9 is not coincident with any of the presetting elements 10a–10c, control signal generator 14 produces, at its output terminal 21, a low level control signal which is applied through switch S to muting circuit 5 to provide the muting operation and no signals are obtained at the output terminals 6R and 6L. The low level control signal from generator 14 is also applied to switching circuit 29 and, as previously mentioned, causes opening of such switching circuit so that the AFC operation is disabled or not realized. When indicator 9 coincides with one of the presetting elements, for example, the element 10a, the shutter portion 11 of the latter blocks the impingement of light from source 9b on photo-sensitive element 9a and, as a result a high level control signal is obtained at the output terminal 21 of generator 14. Such high level control signal is effective in muting circuit 5 to disable the muting operation of the latter so that output signals are obtained at terminals 6R and 6L and the signal broadcast by the desired station is reproduced. The high level control signal is also effective to close switching circuit 29 and thereby provide the AFC operation by which stable reception is ensured.

As is apparent from the above, the AFC circuit operates only when the position of indicator 9 substantially coincides with, for example, is within ±75 to 100 KHz of the position on dial scale 8a at which one of the presetting elements 10a–10c has been previously set. Therefore, only when indicator 9 substantially coincides with any one of the presetting elements 10a–10c, is the AFC circuit with a relatively wider pull-in range of, for example, ±500 KHz, operated to ensure that the signal from the desired station is stably received. On the other hand, when indicator 9 is not within the range of ±75 to 100 KHz in respect to the position of one of the presetting elements 10a–10c, the AFC circuit is inoperative. By way of example, if it is assumed that the presetting element 10b is set at a frequency on scale 8a within the pull-in range of the AFC circuit, that is, ±500 KHz, with respect to the frequency on scale 8a at which the presetting element 10a has been set, then the AFC operation will not occur during the movement of indicator 9 in the range of frequencies that extend, for example, from a frequency 75 KHz greater than the setting of element 10a to a frequency 75 KHz less than the setting of element 10b. However, when indicator 9 approaches to within 75 KHz of the position on dial scale 8a of presetting element 10b, the AFC circuit becomes operative so that the signal broadcast by the station corresponding to the position of element 10b can be stably received.

It will be apparent from the above that, in accordance with this invention, the pull-in range of the AFC circuit can be made sufficiently wide to ensure stable reception, while making it possible to receive selected stations having broadcast frequencies that are spaced from each other by less than such pull-in range of the AFC circuit. Further, the described operation of the AFC circuit is combined with the muting circuit operation, that is, in the intervals of the frequency band where the AFC circuit is made inoperative, the muting circuit 5 performs its muting operation so that undesired signals are not then obtained at the output terminals 6R and 6L.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A tuning apparatus for a broadcast receiver comprising a dial scale representing broadcast frequencies over a predetermined frequency band, a dial indicator movable along said dial scale for indicating the broadcast frequency to which the apparatus is tuned, sensor means coupled with said indicator for movement therewith in respect to said dial scale, said sensor means including photo-sensitive means and a light source for directing light upon said photo-sensitive means across a gap therebetween, presetting means positionable along said dial scale from outside the dial scale for selecting at least one broadcast frequency to be received and having shutter means which extends into said gap of said sensor means when said indicator is disposed to indicate the broadcast frequency selected by said presetting means, whereby to block the impingement of light on said photo-sensitive means from said light source, control signal generating means connected with said photo-sensitive means for producing a muting control signal in response to the extending of said shutter means of said presetting means into said gap of said sensor means, and circuit means responsive to said muting control signal to mute the transmission of a signal by said tuning apparatus in the absence of said muting control signal.

2. A tuning apparatus according to claim 1; in which said light source is constituted by an LED and said photo-sensitive means is constituted by a photo-transistor.

3. A tuning apparatus according to claim 1; in which said presetting means includes a plurality of presetting elements individually movable along said dial scale for selecting different respective broadcast frequencies to be received.

4. A tuning apparatus according to claim 1; further comprising an AFC circuit made operative by said muting control signal.

5. A tuning apparatus for a broadcast receiver comprising a dial scale representing broadcast frequencies over a predetermined frequency band; an indicator movable along said dial scale for indicating the broadcast frequency to which the apparatus is tuned; sensor means movable with said indicator in respect to said dial scale, said sensor means including a photo-transistor and an LED for directing light upon said photo-transistor across a gap therebetween; presetting means positionable along said dial scale for selecting at least one broadcast frequency to be received and having shutter means which, when said indicator and said presetting means indicate the same broadcasting frequency, extends in said gap to block the impingement of light on said photo-transistor from said LED; said control signal generating means including a DC voltage source, a first resistor through which said LED is connected with said voltage source, a second resistor through which said photo-transistor is connected with said voltage source, a first switching transistor having a base-emitter circuit connected across said photo-transistor and a collector, a third resistor through which said collector is connected with said voltage source, and output circuit means connected with said third resistor to provide a control signal when said shutter means is interposed in said gap between said LED and said photo-transistor; and circuit means responsive to said control signal to control a function of said tuning apparatus.

6. A tuning apparatus according to claim 5; in which said output circuit means includes a second switching transistor having a base-emitter circuit connected across said third resistor and a collector at which said control signal appears.

7. A tuning apparatus according to claim 6; in which said control signal generating means further includes a positive feedback loop connected between the collector of said second switching transistor and a connection point of said first resistor with said LED.

8. A tuning apparatus according to claim 7; in which said DC voltage source has first and second terminals, and said first resistor is connected between said first terminal and said LED; and in which said positive feedback loop includes a fourth resistor, and a further transistor having a collector-emitter circuit connected between said connection point of the first resistor with the LED and said second terminal of the voltage source, said further transistor also having a base connected to the collector of said second switching transistor through said fourth resistor.

* * * * *